(12) United States Patent
Hsieh et al.

(10) Patent No.: US 11,460,486 B1
(45) Date of Patent: Oct. 4, 2022

(54) PROBE CARD DEVICE AND SPRING-LIKE PROBE

(71) Applicant: CHUNGHWA PRECISION TEST TECH. CO., LTD., Taoyuan (TW)

(72) Inventors: Kai-Chieh Hsieh, Taoyuan (TW); Wei-Jhih Su, Taichung (TW); Hong-Ming Chen, Taoyuan (TW); Vel Sankar Ramachandran, Taoyuan (TW)

(73) Assignee: CHUNGHWA PRECISION TEST TECH. CO., LTD., Taoyuan (TW)

( * ) Notice: Subject to any disclaimer, the term of this patent is extended or adjusted under 35 U.S.C. 154(b) by 0 days.

(21) Appl. No.: 17/491,621

(22) Filed: Oct. 1, 2021

(30) Foreign Application Priority Data

Apr. 14, 2021 (TW) .................................. 110113400

(51) Int. Cl.
*G01R 1/02* (2006.01)
*G01R 1/04* (2006.01)
*G01R 1/067* (2006.01)
*G01R 1/073* (2006.01)
*G01R 31/28* (2006.01)

(52) U.S. Cl.
CPC ..... *G01R 1/07342* (2013.01); *G01R 1/07314* (2013.01); *G01R 1/07378* (2013.01); *G01R 31/2886* (2013.01)

(58) Field of Classification Search
CPC . G01R 1/02; G01R 1/04; G01R 1/067; G01R 1/073; G01R 31/28; G01R 31/2886; G01R 31/2831
See application file for complete search history.

(56) References Cited

U.S. PATENT DOCUMENTS 10,119,991 B2 * 11/2018 Chen .................. G01R 31/2891

\* cited by examiner

*Primary Examiner* — Neel D Shah
(74) *Attorney, Agent, or Firm* — Li & Cai Intellectual Property (USA) Office

(57) ABSTRACT

A probe card device and a spring-like probe are provided. The spring-like probe defines a longitudinal direction and a separation plane that is parallel to the longitudinal direction, and includes a fixing end portion, a testing end portion, and two stroke arms that are arranged between the fixing end portion and the testing end portion. The two stroke arms are spaced apart from each other and are respectively located at two opposite sides of the separation plane. Each of the two stroke arms is in a curved shape. Two projection regions defined by orthogonally projecting the two stroke arms onto the separation plane have at least one intersection point. In a cross section of the two stroke arms perpendicular to the longitudinal direction, an area of any one of the two stroke arms is 95% to 105% of an area of another one of the two stroke arms.

10 Claims, 9 Drawing Sheets

PROBE CARD DEVICE AND SPRING-LIKE PROBE

CROSS-REFERENCE TO RELATED PATENT APPLICATION

This application claims the benefit of priority to Taiwan Patent Application No. 110113400, filed on Apr. 14, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a probe card, and more particularly to a probe card device and a spring-like probe.

BACKGROUND OF THE DISCLOSURE

A conventional probe card device includes a plurality of conductive probes that are used for transmitting signal and current. However, a structure of the conventional conductive probe has been gradually limited by the existing structural design, such that it is difficult to develop a new structure. For example, for the conventional conductive probe (e.g., a pogo pin) to have a spring function, more than one component needs to be provided therein.

SUMMARY OF THE DISCLOSURE

In response to the above-referenced technical inadequacy, the present disclosure provides a probe card device and a spring-like probe to effectively improve on the issues associated with conventional conductive probes.

In one aspect, the present disclosure provides a probe card device, which includes a first guiding board unit, a second guiding board unit, and a plurality of spring-like probes. The second guiding board unit is spaced apart from the first guiding board unit. The spring-like probes pass through the first guiding board unit and the second guiding board unit. Each of the spring-like probes defines a longitudinal direction and a separation plane that is parallel to the longitudinal direction. Each of the spring-like probes includes a fixing end portion and a testing end portion. In each of the spring-like probes, the fixing end portion is located at an outer side of the first guiding board unit away from the second guiding board unit, the testing end portion is located at an outer side of the second guiding board unit away from the first guiding board unit, and the testing end portion is configured to detachably abut against a device under test (DUT). Moreover, a portion of each of the spring-like probes arranged between the fixing end portion and the testing end portion includes two stroke arms that are spaced apart from each other and that are respectively located at two opposite sides of the separation plane. In each of the spring-like probes, each of the two stroke arms is in a curved shape, and two projection regions defined by orthogonally projecting the two stroke arms onto the separation plane have at least one intersection point. In a cross section of the two stroke arms of each of the spring-like probes perpendicular to the longitudinal direction, a cross-sectional area of any one of the two stroke arms is 95% to 105% of a cross-sectional area of another one of the two stroke arms.

In another aspect, the present disclosure provides a spring-like probe, which defines a longitudinal direction and a separation plane that is parallel to the longitudinal direction. The spring-like probe includes a fixing end portion and a testing end portion. The fixing end portion is configured to abut against a space transformer, and the testing end portion is configured to detachably abut against a device under test. Moreover, a portion of the spring-like probe arranged between the fixing end portion and the testing end portion includes two stroke arms that are spaced apart from each other and that are respectively located at two opposite sides of the separation plane. Each of the two stroke arms is in a curved shape, and two projection regions defined by orthogonally projecting the two stroke arms onto the separation plane have at least one intersection point. In a cross section of the two stroke arms of the spring-like probe perpendicular to the longitudinal direction, a cross-sectional area of any one of the two stroke arms is 95% to 105% of a cross-sectional area of another one of the two stroke arms.

Therefore, any one of the spring-like probes of the probe card device in the present disclosure can have a spring-like function, so as to provide a new conductive probe structure through a structural design of the two stroke arms being located between the fixing end portion and the testing end portion (e.g., the two stroke arms are spaced apart from each other and are respectively located at two opposite sides of the separation plane; two projection regions defined by orthogonally projecting the two stroke arms onto the separation plane have at least one intersection point).

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
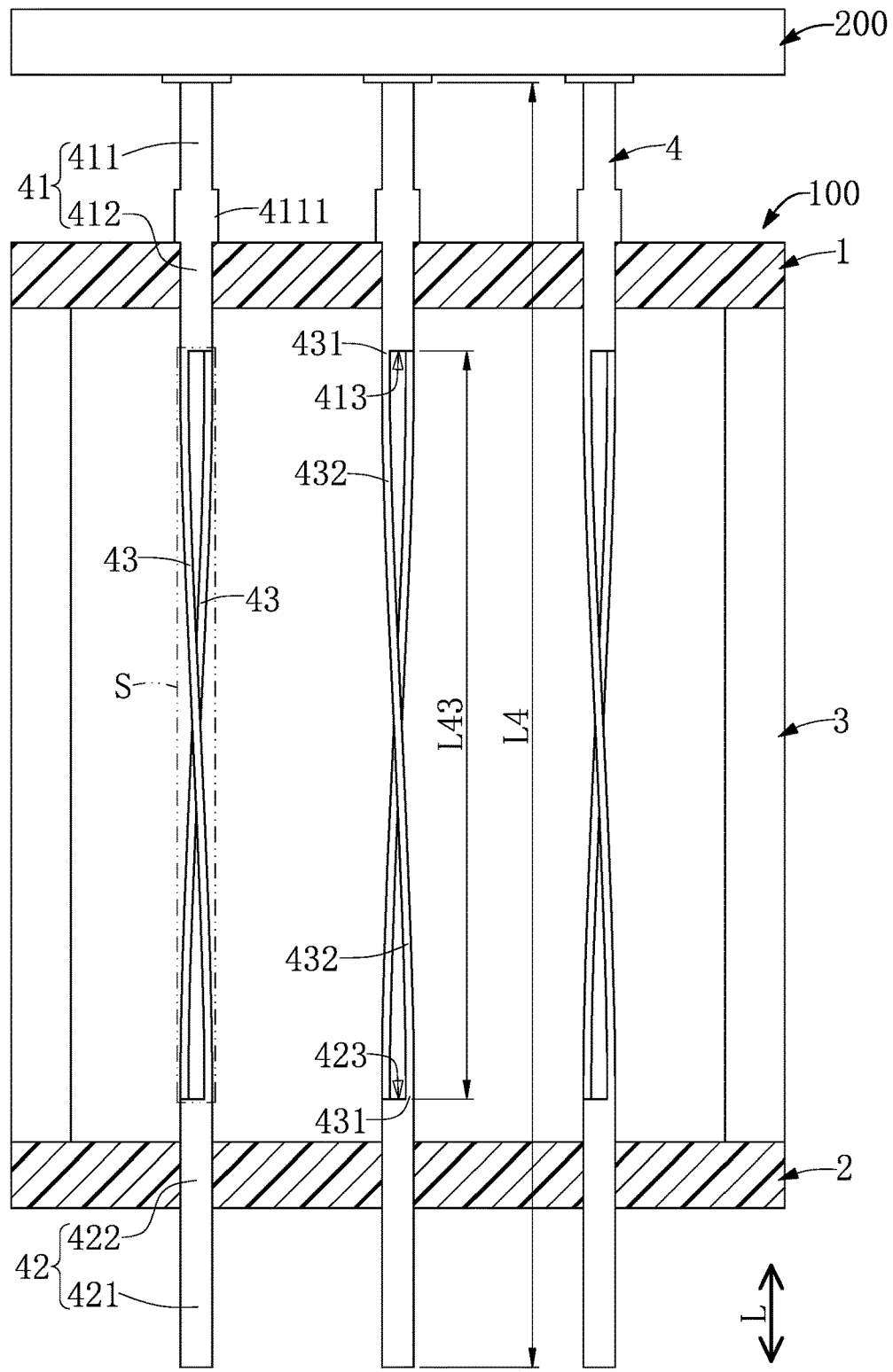
FIG. 1 is a schematic planar view of a probe card device according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 9, a first embodiment of the present disclosure provides a probe card device 1000. The probe card device 1000 in the present embodiment includes a probe head 100 and a space transformer 200 that is connected to one side of the probe head 100 (e.g., a top side of the probe head 100 shown in FIG. 1). Another side of the probe head 100 (e.g., a bottom side of the probe head 100 shown in FIG. 1) is configured to abut against a device under test (DUT) (e.g., a semiconductor wafer that is not shown in the drawings).

It should be noted that, in order to clearly describe a structural and connection relationship of each component of the probe card device 1000, the drawings of the present embodiment only show a portion of the probe card device 1000, but the present disclosure is not limited thereto. The following description describes the structural and connection relationship of each component of the probe card device 1000.

Figure 2:
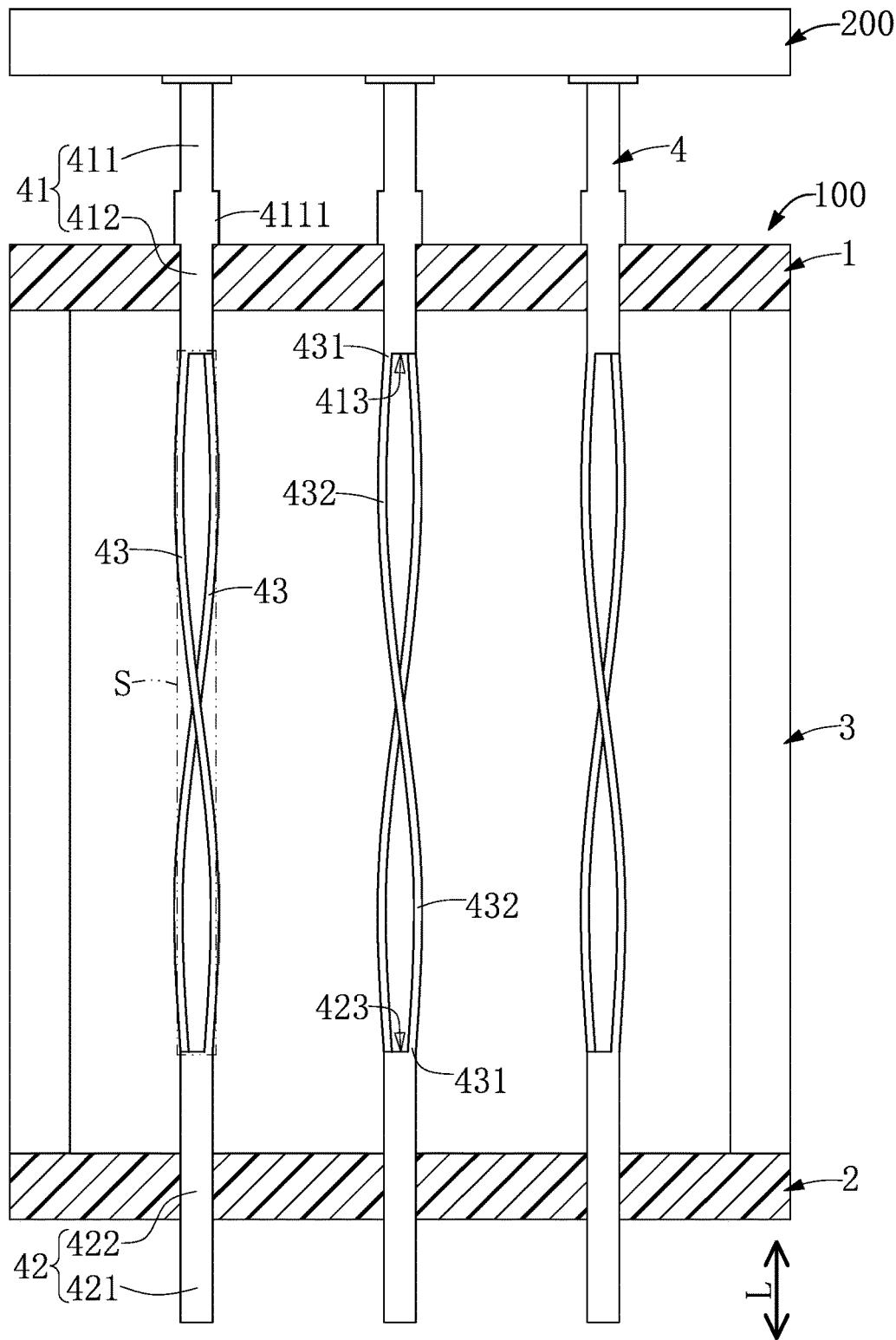
FIG. 2 is a schematic planar view showing each of a plurality of spring-like probes being pressed along a longitudinal direction of the probe card device of FIG. 1.

As shown in FIG. 1 and FIG. 2, the probe head 100 includes a first guiding board unit 1, a second guiding board unit 2 spaced apart from the first guiding board unit 1, a spacer 3 sandwiched between the first guiding board unit 1 and the second guiding board unit 2, and a plurality of spring-like probes 4 that pass through (and are retained by) the first guiding board unit 1 and the second guiding board unit 2.

It should be noted that the spring-like probes 4 in the present embodiment are described in cooperation with the first guiding board unit 1, the second guiding board unit 2, and the spacer 3, but the present disclosure is not limited thereto. For example, in other embodiments of the present disclosure not shown in the drawings, the spring-like probes 4 can also be independently used (e.g., sold) or can be used in cooperation with other components. Moreover, the first guiding board unit 1 and the second guiding board unit 2 of the probe head 100 can be not staggered relative to each other by using the structural design of the spring-like probes 4, but the present disclosure is not limited thereto.

In the present embodiment, the first guiding board unit 1 includes one first guiding board, and the second guiding board unit 2 includes one second guiding board. However, in other embodiments of the present disclosure not shown in the drawings, the first guiding board unit 1 can include a plurality of first guiding boards and at least one spacing sheet that is sandwiched between any two of the first guiding boards adjacent to each other, and the second guiding board unit 2 can include a plurality of second guiding boards and at least one spacing sheet that is sandwiched between any two of the second guiding boards adjacent to each other. Furthermore, the first guiding boards are in a staggered arrangement, and the second guiding boards are in a staggered arrangement.

Moreover, the spacer 3 can be an annular structure and is sandwiched between a peripheral portion of the first guiding board unit 1 and a peripheral portion of the second guiding board unit 2, but the present disclosure is not limited thereto. For example, in other embodiments of the present disclosure not shown in the drawings, the spacer 3 of the probe card device 1000 can be omitted or can be replaced by other components.

As the spring-like probes 4 in the present embodiment are of substantially the same structure, the following description discloses the structure of just one of the spring-like probes 4 for the sake of brevity, but the present disclosure is not limited thereto. For example, in other embodiments of the present disclosure not shown in the drawings, the spring-like probes 4 can be of different structure.

Figure 3:
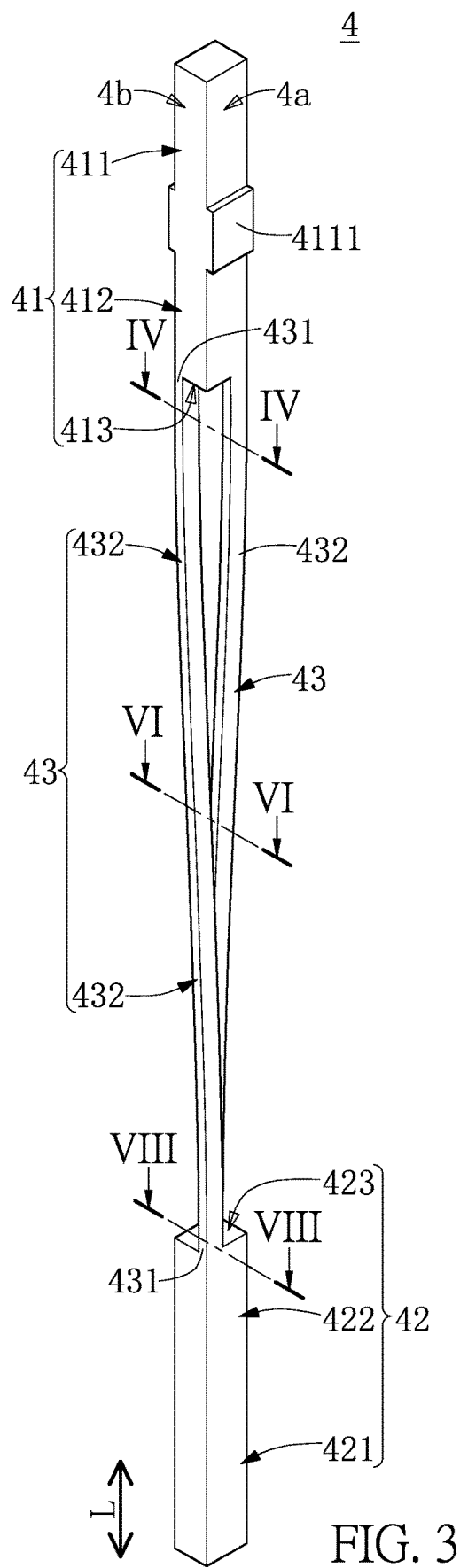
FIG. 3 is a perspective view of the spring-like probe according to the first embodiment of the present disclosure.

As shown in FIG. 1 and FIG. 3, the spring-like probe 4 is integrally formed as a single one-piece structure, and the spring-like probe 4 is in a substantial straight shape defining a longitudinal direction L. The spring-like probe 4 has a probe length L4 in the longitudinal direction L, and the probe length L4 in the present embodiment is less than or equal to 4 mm.

Moreover, an outer surface of the spring-like probe 4 includes two broad lateral surfaces 4a and two narrow lateral surfaces 4b. The two broad lateral surfaces 4a and the two narrow lateral surfaces 4b are parallel to the longitudinal direction L, the two broad lateral surfaces 4a are respectively arranged on two opposite sides of the spring-like probe 4, and the two narrow lateral surfaces 4b are respectively arranged on another two opposite sides of the spring-like probe 4.

Figure 4:
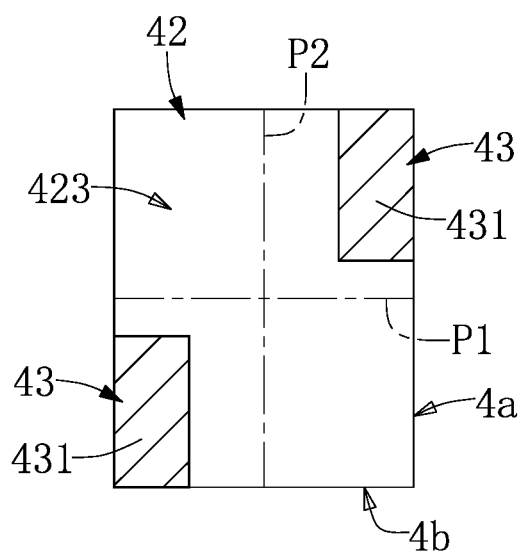
FIG. 4 is a cross-sectional planar view taken along line IV-IV of FIG. 3.
Figure 5:
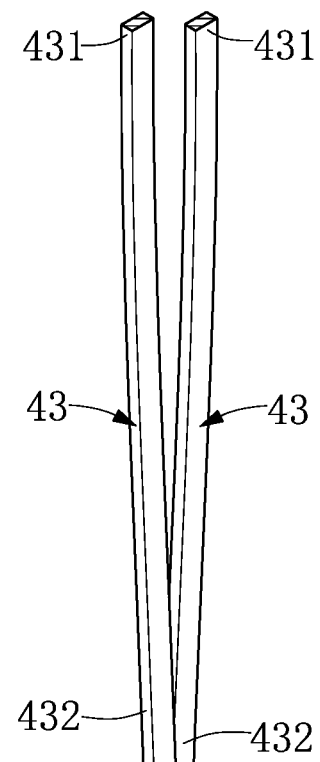
FIG. 5 is a cross-sectional perspective view taken along the line IV-IV of FIG. 3.

As shown in FIG. 1, FIG. 3, and FIG. 4, in order to clearly describe the specific structure of the spring-like probe 4 of the present embodiment, the spring-like probe 4 further defines a separation plane P1 parallel to the longitudinal direction L and a distribution plane P2 that is parallel to the longitudinal direction L and that is perpendicular to the separation plane P1. In the present embodiment, the separation plane P1 is perpendicular to any one of the two broad lateral surfaces 4a and can be overlapped with a perpendicular bisecting plane of any one of the two broad lateral surfaces 4a. Moreover, the distribution plane P2 is perpendicular to any one of the two narrow lateral surfaces 4b and can be overlapped with a perpendicular bisecting plane of any one of the two narrow lateral surfaces 4b, but the present disclosure is not limited thereto. For example, in other embodiments of the present disclosure not shown in the drawings, the separation plane P1 can be perpendicular to any one of the two narrow lateral surfaces 4b, and the distribution plane P2 is perpendicular to any one of the two broad lateral surfaces 4a.

In other words, the spring-like probe 4 includes a first segment 41, a second segment 42 that is spaced apart from the first segment 41 along the longitudinal direction L, and two stroke arms 43 that are connected to the first segment 41 and the second segment 42 (e.g., two opposite ends 431 of any one of the two stroke arms 43 are respectively connected to the first segment 41 and the second segment 42). Specifically, any one of the first segment 41 and the second segment 42 in the present embodiment is only connected to the two stroke arms 43.

The first segment 41 has a fixing end portion 411 and a first extension portion 412 that is connected to the first end portion 411. The fixing end portion 411 has two limiting protrusions 4111 respectively arranged on two opposite sides thereof (e.g., the two broad lateral surfaces 4a). The second segment 42 has a testing end portion 421 and a second extension portion 422 that is connected to the testing end portion 421. The first extension portion 412 and the second extension portion 422 are arranged adjacent to each other (or face toward each other).

Moreover, any one of the two stroke arms 43 has a length L43 in the longitudinal direction L that is 50% to 90% of the probe length L4. The two opposite ends 431 of any one of the two stroke arms 43 are respectively connected to end surfaces 413, 423 of the first extension portion 412 and the second extension portion 422 facing each other. In the present embodiment, the two stroke arms 43 are arranged in a space S between the first segment 41 and the second segment 42, and the spring-like probe 4 is configured to be pressed along the longitudinal direction L so as to deform the two stroke arms 43 toward an outside of the space S, but the present disclosure is not limited thereto. For example, in other embodiments of the present disclosure not shown in the drawings, when the spring-like probe 4 is in an initial mode and not pressed, any one of the two stroke arms 43 can be partially located at the outside of the space S.

Specifically, a part of the first extension portion 412 is arranged in the first guiding board unit 1, and a residual part of the first extension portion 412 is arranged between the first guiding board unit 1 and the second guiding board unit 2. The fixing end portion 411 is located at an outer side of the first guiding board unit 1 (e.g., an upper side of the first guiding board unit 1 shown in FIG. 1) away from the second guiding board unit 2. The two limiting protrusions 4111 of the fixing end portion 411 are configured to abut against an outer surface of the first guiding board unit 1, and an end of the fixing end portion 411 is configured to abut against the space transformer 200.

Moreover, a part of the second extension portion 422 is arranged in the second guiding board unit 2, and a residual part of the second extension portion 422 is arranged between the first guiding board unit 1 and the second guiding board unit 2. The testing end portion 421 is located at an outer side of the second guiding board unit 2 (e.g., a lower side of the second guiding board unit 2 shown in FIG. 1) away from the first guiding board unit 1. An end of the testing end portion 421 is configured to detachably abut against the DUT.

In addition, the two stroke arms 43 in the present embodiment are arranged between the first guiding board unit 1 and the second guiding board unit 2. It should be noted that the two stroke arms 43 are required to be arranged at a portion of the spring-like probe 4 between the fixing end portion 411 and the testing end portion 421, but the specific structure of any one of the first segment 41 and the second segment 42 can be changed or adjusted according to design requirements and is not limited by the present embodiment. For example, in other embodiments of the present disclosure not shown in the drawings, at least one of the first extension portion 412 of the first segment 41 and the second extension portion 422 of the second segment 42 can be omitted.

Figure 6:
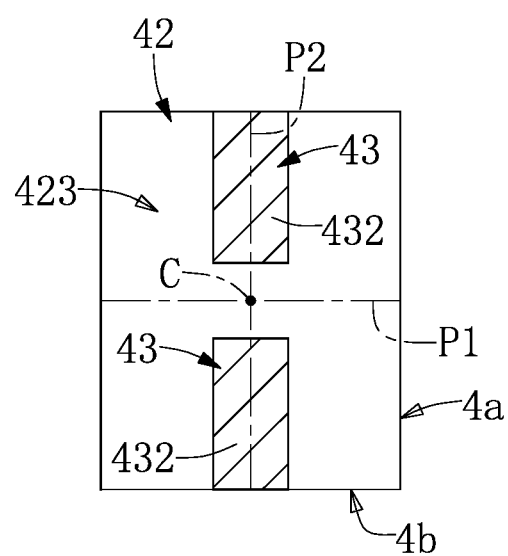
FIG. 6 is a cross-sectional planar view taken along line VI-VI of FIG. 3.
Figure 7:
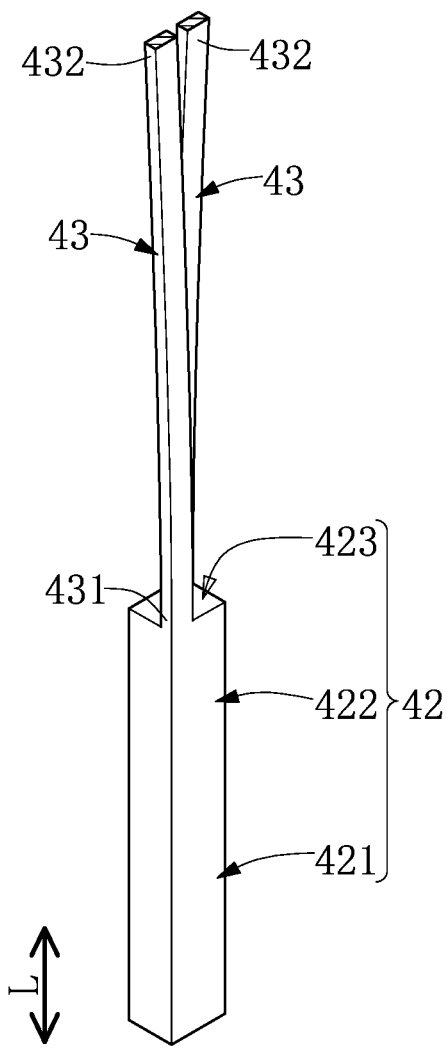
FIG. 7 is a cross-sectional perspective view taken along the line VI-VI of FIG. 3.
Figure 8:
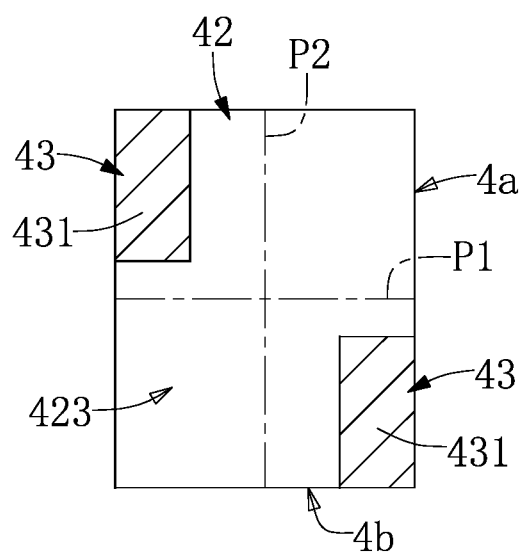
FIG. 8 is a cross-sectional planar view taken along line VIII-VIII of FIG. 3.
Figure 9:
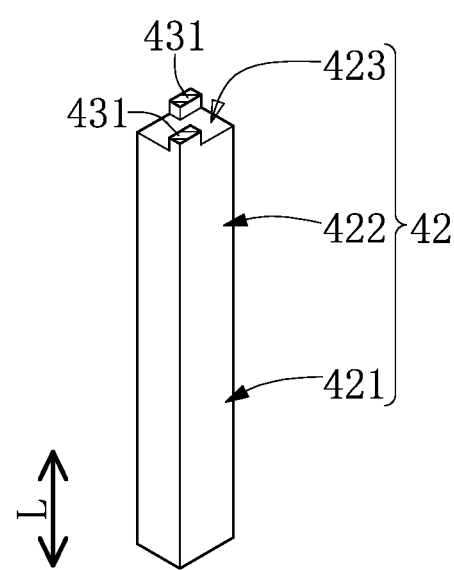
FIG. 9 is a cross-sectional perspective view taken along the line VIII-VIII of FIG. 3.
Figure 10:
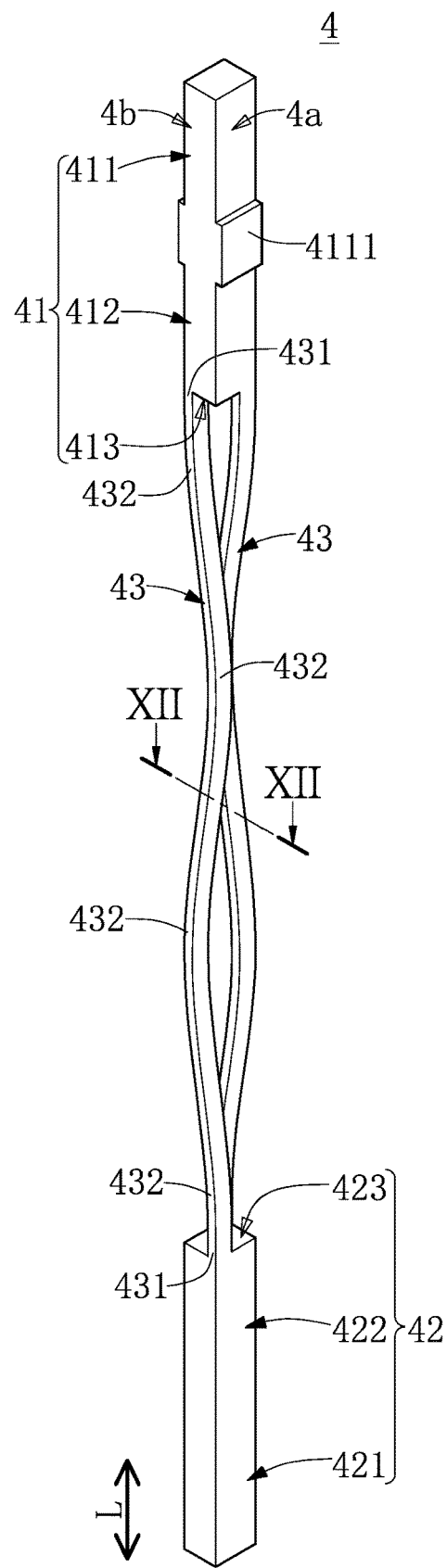
FIG. 10 is a perspective view of a spring-like probe according to a second embodiment of the present disclosure.
Figure 11:
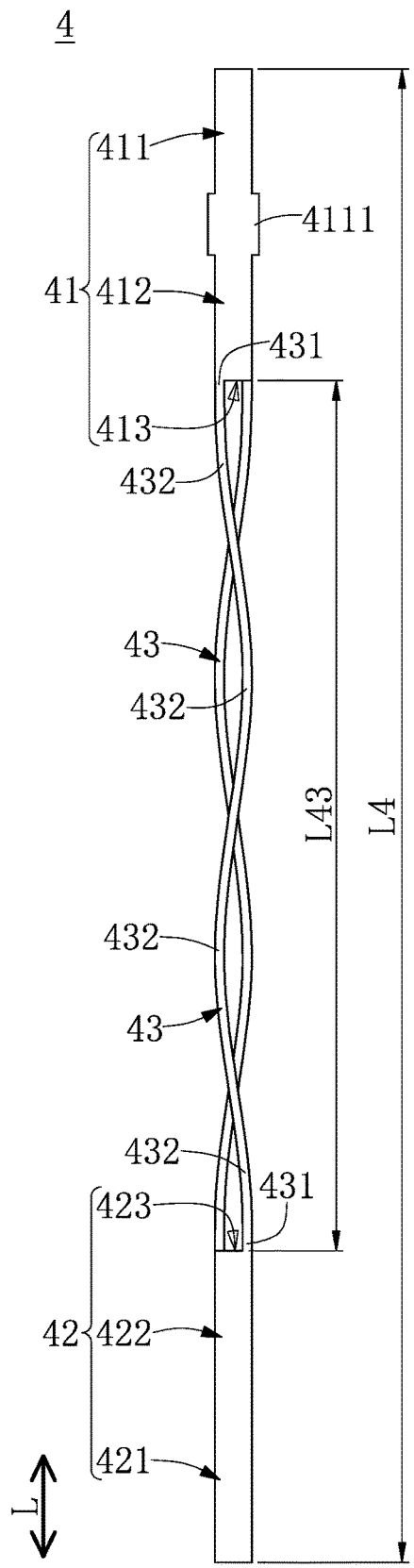
FIG. 11 is a planar side view of FIG. 10.
Figure 12:
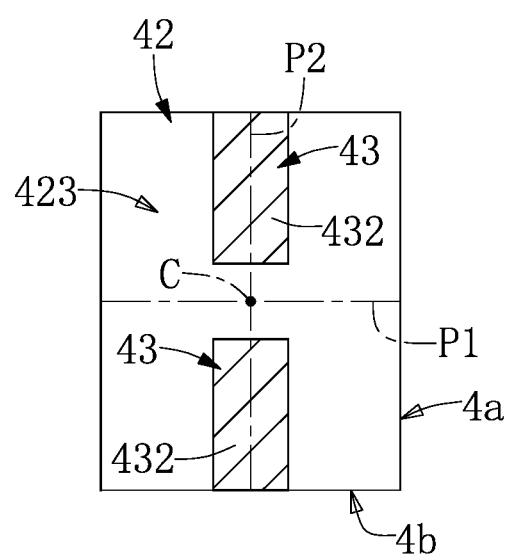
FIG. 12 is a cross-sectional planar view taken along line XII-XII of FIG. 10.
Figure 13:
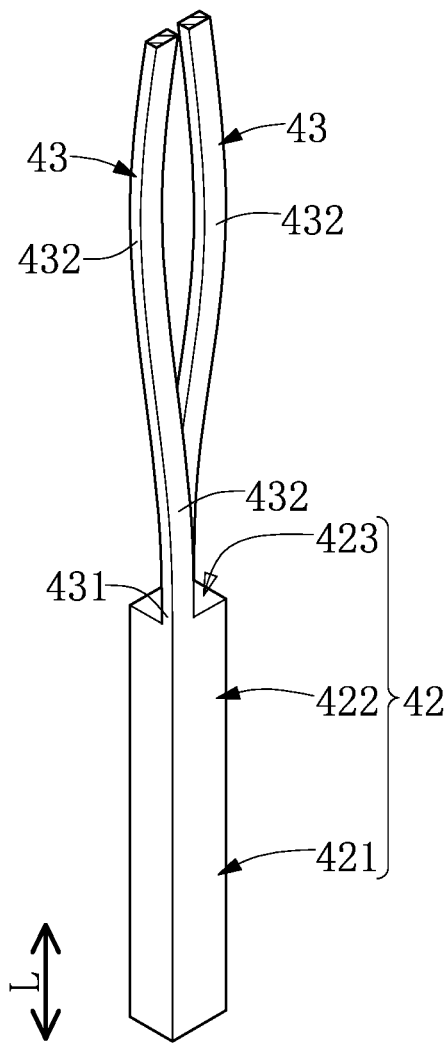
FIG. 13 is a cross-sectional perspective view taken along the line XII-XII of FIG. 10.

In order to endow the spring-like probe 4 with a spring-like function, the two stoke arms 43 preferably have at least one of the following features. As shown in FIG. 3 to FIG. 9, each of the two stroke arms 43 is in a curved shape. The two stroke arms 43 are spaced apart from each other and are respectively located at two opposite sides of the separation plane P1 (as shown in FIG. 4, FIG. 6, and FIG. 8), and the two opposite ends 431 of any one of the two stroke arms 43 are respectively located at two opposite sides of the distribution plane P2 (as shown in FIG. 4 and FIG. 8).

In other words, each of the end surface 413 of the first extension portion 412 and the end surface 423 of the second extension portion 422 can be divided into four quadrants by the separation plane P1 and the distribution plane P2, and the four quadrants of the end surface 413 of the first extension portion 412 respectively correspond in position along the longitudinal direction L to the four quadrants of the end surface 423 of the second extension portion 422.

Moreover, two of the four quadrants of the end surface 413 of the first extension portion 412 diagonally arranged relative to each other are respectively connected to the two stroke arms 43, and two of the four quadrants of the end surface 423 of the second extension portion 422 diagonally arranged relative to each other are respectively connected to the two stroke arms 43. Moreover, the two of the four quadrants of the end surface 413 of the first extension portion 412 do not correspond in position along the longitudinal direction L to the two of the four quadrants of the end surface 423 of the second extension portion 422.

Specifically, two projection regions defined by orthogonally projecting the two stroke arms 43 onto the separation plane P1 have an intersection point C, and each of the two stroke arms 43 has a recurve point corresponding in position to the intersection point C. In other words, any one of the two stroke arms 43 includes two arced portions 432 that are sequentially connected to each other. Moreover, the recurve point is located at the connection of the two arced portions 432, and the two arced portions 432 are respectively located at the two opposite sides of the distribution plane P2, but the present disclosure is not limited thereto. For example, on the two projection regions, any one of a quantity of the intersection point C and a quantity of the recurve point can be at least one.

In addition, in a cross section of the two stroke arms 43 of the spring-like probe 4 perpendicular to the longitudinal direction L, a cross-sectional area of any one of the two stroke arms is 95% to 105% (e.g., 100%) of a cross-sectional area of another one of the two stroke arms 43, so that the two stroke arms 43 can have the substantially same electrical conductivity (e.g., the substantially same resistance).

Second Embodiment

Referring to FIG. 10 to FIG. 13, a second embodiment of the present disclosure is similar to the first embodiment of the present disclosure. For the sake of brevity, descriptions of the same components in the first and second embodiments of the present disclosure will be omitted herein, and the following description only discloses different features between the first and second embodiments.

In the present embodiment, two projection regions defined by orthogonally projecting the two stroke arms 43 onto the separation plane P1 have a plurality of intersection points C, and each of the two stroke arms 43 has a plurality of recurve points respectively corresponding in position to the intersection points C. In each of the spring-like probes 4 of the present embodiment, a quantity of the intersection points C located on the two projection regions is an odd number. Any one of the two stroke arms 43 includes a plurality of arced portions 432 that are sequentially connected to each other, and the arced portions 432 are respectively located at the two opposite sides of the distribution plane P2.

Beneficial Effects of the Embodiments

In conclusion, any one of the spring-like probes of the probe card device in the present disclosure can have a spring-like function, so as to provide a new conductive probe structure through a structural design of the two stroke arms being located between the fixing end portion and the testing end portion (e.g., the two stroke arms are spaced apart from each other and are respectively located at two opposite sides of the separation plane; two projection regions defined by orthogonally projecting the two stroke arms onto the separation plane have at least one intersection point).

Moreover, in any one of the spring-like probes of the probe card device of the present disclosure, the cross-sectional areas of the two stroke arms are substantially the same, so that the two stroke arms can have the substantially same electrical conductivity (e.g., the substantially same resistance).

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A probe card device, comprising:
    a first guiding board unit and a second guiding board unit that is spaced apart from the first guiding board unit; and
    a plurality of spring-like probes passing through the first guiding board unit and the second guiding board unit, wherein each of the spring-like probes defines a longitudinal direction and a separation plane that is parallel to the longitudinal direction, and each of the spring-like probes includes:
        a fixing end portion located at an outer side of the first guiding board unit away from the second guiding board unit; and
        a testing end portion located at an outer side of the second guiding board unit away from the first guiding board unit, wherein the testing end portion is configured to detachably abut against a device under test (DUT);
    wherein a portion of each of the spring-like probes arranged between the fixing end portion and the testing end portion includes two stroke arms that are spaced apart from each other and that are respectively located at two opposite sides of the separation plane, and wherein, in each of the spring-like probes, each of the two stroke arms is in a curved shape, and two projection regions defined by orthogonally projecting the two stroke arms onto the separation plane have at least one intersection point;
    wherein, in a cross section of the two stroke arms of each of the spring-like probes perpendicular to the longitudinal direction, a cross-sectional area of any one of the two stroke arms is 95% to 105% of a cross-sectional area of another one of the two stroke arms.

2. The probe card device according to claim 1, wherein each of the spring-like probes includes a first segment that has the fixing end portion and a second segment that has the testing end portion, and wherein, in each of the spring-like probes, two opposite ends of each of the two stroke arms are respectively connected to the first segment and the second segment.

3. The probe card device according to claim 2, wherein, in each of the spring-like probes, the two stroke arms are arranged in a space between the first segment and the second segment.

4. The probe card device according to claim 3, wherein the first guiding board unit and the second guiding board unit are not staggered relative to each other, and any one of the spring-like probes is configured to be pressed along the longitudinal direction, so as to deform the two stroke arms toward an outside of the space.

5. The probe card device according to claim 1, wherein each of the spring-like probes defines a distribution plane that is parallel to the longitudinal direction and that is perpendicular to the separation plane, and wherein, in each of the spring-like probes, two opposite ends of each of the two stroke arms are respectively located at two opposite sides of the distribution plane.

6. The probe card device according to claim 1, wherein each of the spring-like probes has a probe length in the longitudinal direction, and wherein, in each of the spring-like probes, any one of the two stroke arms has a length in the longitudinal direction that is 50% to 90% of the probe length.

7. The probe card device according to claim 6, wherein the probe length of each of the spring-like probes is less than or equal to 4 mm, and wherein, in each of the spring-like probes, a quantity of the at least one intersection point located on the two projection regions is an odd number.

8. The probe card device according to claim 1, wherein an outer surface of each of the spring-like probes has two broad lateral surfaces that are parallel to the longitudinal direction and that are respectively arranged on two opposite sides thereof, and wherein, in each of the spring-like probes, the separation plane is perpendicular to any one of the two broad lateral surfaces.

9. A spring-like probe defining a longitudinal direction and a separation plane that is parallel to the longitudinal direction, the spring-like probe comprising:
 a fixing end portion configured to abut against a space transformer; and
 a testing end portion configured to detachably abut against a device under test (DUT);
 wherein a portion of the spring-like probe arranged between the fixing end portion and the testing end portion includes two stroke arms that are spaced apart from each other and that are respectively located at two opposite sides of the separation plane, and wherein each of the two stroke arms is in a curved shape, and two projection regions defined by orthogonally projecting the two stroke arms onto the separation plane have at least one intersection point;
 wherein, in a cross section of the two stroke arms of the spring-like probe perpendicular to the longitudinal direction, a cross-sectional area of any one of the two stroke arms is 95% to 105% of a cross-sectional area of another one of the two stroke arms.

10. The spring-like probe according to claim 9, further comprising a first segment having the fixing end portion and a second segment having the testing end portion, wherein two opposite ends of each of the two stroke arms are respectively connected to the first segment and the second segment, and the two stroke arms are arranged in a space between the first segment and the second segment, wherein the spring-like probe defines a distribution plane that is parallel to the longitudinal direction and that is perpendicular to the separation plane, and the two opposite ends of each of the two stroke arms are respectively located at two opposite sides of the distribution plane, and wherein any one of the two stroke arms has a plurality of arced portions that are sequentially connected to each other and that are respectively located at the two opposite sides of the distribution plane.

* * * * *